(12) United States Patent
Hashimoto

(10) Patent No.: US 7,645,706 B2
(45) Date of Patent: Jan. 12, 2010

(54) ELECTRONIC SUBSTRATE MANUFACTURING METHOD

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 467 days.

(21) Appl. No.: 11/480,216

(22) Filed: Jun. 30, 2006

(65) Prior Publication Data

US 2007/0009837 A1    Jan. 11, 2007

(30) Foreign Application Priority Data

Jul. 7, 2005    (JP) .............................. 2005-198493

(51) Int. Cl.
*H01L 21/302*    (2006.01)

(52) U.S. Cl. ...................... 438/719; 438/700; 438/720; 216/16; 216/17

(58) Field of Classification Search ................ 438/700, 438/702, 706, 710, 719, 720, 723, 724, 725; 216/16, 17, 20, 23, 58, 67, 74, 75, 79
See application file for complete search history.

(56) References Cited

U.S. PATENT DOCUMENTS

| | | | | |
|---|---|---|---|---|
| 4,952,528 A | * | 8/1990 | Abe et al. .................... | 438/638 |
| 5,759,422 A | * | 6/1998 | Schmelzer et al. ............ | 216/35 |
| 6,103,617 A | * | 8/2000 | Yoon et al. ................... | 438/624 |
| 2001/0012663 A1 | * | 8/2001 | Magri' et al. ................ | 438/267 |
| 2002/0163611 A1 | * | 11/2002 | Kamijima et al. ............ | 349/122 |
| 2005/0212085 A1 | * | 9/2005 | Hashimoto et al. .......... | 257/537 |
| 2005/0236104 A1 | * | 10/2005 | Tanaka ..................... | 156/308.2 |
| 2006/0009025 A1 | * | 1/2006 | Kanamura ................. | 438/618 |
| 2007/0020927 A1 | * | 1/2007 | Hashimoto .................. | 438/669 |

FOREIGN PATENT DOCUMENTS

| JP | 58-007848 | 1/1983 |
|---|---|---|
| JP | 2003-046026 | 2/2003 |

* cited by examiner

*Primary Examiner*—Kin-Chan Chen
(74) *Attorney, Agent, or Firm*—Harness, Dickey & Pierce, P.L.C.

(57) ABSTRACT

An electronic substrate manufacturing method includes: forming a wiring pattern on a substrate; providing a mask with an opening for the substrate on which the wiring pattern has been formed; performing a specified treatment in a part area of the wiring pattern through the opening of the mask. The opening has a size based on an accuracy of an alignment between the substrate and the mask.

10 Claims, 8 Drawing Sheets

ELECTRONIC SUBSTRATE MANUFACTURING METHOD

CROSS-REFERENCE TO RELATED APPLICATION

This application claims priority to Japanese Patent Application No. 2005-198493, filed Jul. 7, 2005, the contents of which are incorporated herein by reference.

BACKGROUND

1. Technical Field

The present invention relates to an electronic device and its manufacturing method, an electro-optical device and its manufacturing method, and electronic apparatus and its manufacturing method.

2. Related Art

In recent years, miniaturization and densification of the packaging of semiconductor devices itself are being demanded with the miniaturization and higher functionality of electronic devices. One such example that is well known is the technology for integrating resistance in semiconductor element using polysilicon. For instance, the technology for forming resistance using polycrystalline grain boundary doped with impurities in polysilicon has been disclosed in Japanese Unexamined Patent Application, First Publication No. S58-7848. Also, the technology for forming a resistance part by applying and curing resistance paste by the thick film formation method in a rearranged wiring section on a semiconductor element, has been disclosed in Japanese Unexamined Patent Application, First Publication No. 2003-46026.

When performing impedance control and the like using passive elements such as resistances installed on a substrate, the resistance value has to be controlled accurately. However, it is difficult to ensure the required accuracy in the art mentioned above, and resistance parts with high reliability cannot be obtained. Moreover, an independent process is necessary to form a resistance part, and the problem in the art mentioned above is that productivity decreases.

To resolve such a problem, the formation of resistance elements using a part of wiring patterns installed on substrates, such as rearranged wiring patterns, may be considered. In this case, wiring can be manufactured using mask, but if the mask alignment accuracy with respect to the substrate is poor, the offset between the mask opening and wiring pattern increases, and the resistance elements formed corresponding to the opening cannot be obtained in the specified area.

SUMMARY

An advantage of some aspects of the invention is to provide an electronic substrate and its manufacturing method, an electro-optical device manufacturing method, and an electronic apparatus manufacturing method that enables highly accurate resistance parts to be formed.

An electronic substrate manufacturing method according to an aspect of the present invention includes: forming a wiring pattern on a substrate; providing a mask with an opening for the substrate on which the wiring pattern has been formed; performing a specified treatment in a part area of the wiring pattern through the opening of the mask; wherein the opening has a size based on an accuracy of an alignment between the substrate and the mask. It is preferable that the size of the opening be greater than a sum of a size of the part area and a permissible error of the alignment.

In this method, even if an error occurs in the alignment between the substrate and the mask, since the opening of the mask is formed to a size that includes the offset based on the accuracy of the alignment, the formation of the wiring pattern to a size smaller than the specified size can be easily prevented.

It is preferable that the performing of the specified treatment have removing a part of the wiring pattern to form a resistance element. In this method, the resistance element is formed by processing the wiring pattern; therefore, an independent process for forming a separate resistance element is not necessary. Thus, the drop in productivity can be avoided.

It is preferable that the forming of the wiring pattern have forming a first wiring pattern on the substrate, and forming a second wiring pattern made of a material different from a material of the first wiring pattern, on the first wiring pattern. In this method, if the second wiring pattern is removed by processing through the opening, then resistance element can be formed in a part of the wiring pattern with the first wiring pattern locally. Moreover, if the second wiring pattern is to be removed by etching, then only the second wiring pattern can be removed easily by selecting an etching material to match the second wiring pattern.

It is preferable that the material of the first wiring pattern have a resistance value higher than that of the material of the second wiring pattern. In this method, resistance element with large resistance value can be easily formed.

It is preferable that the method further include covering with a protective film the wiring pattern on which the specified treatment has been performed. In this method, the resistance element is protected, and corrosion and short circuit are prevented.

It is preferable that the mask be made of a resin material coated on the substrate. In this method, the mask can be easily formed by a method such as spin coating method, droplet ejection method, or printing method.

It is preferable that the mask be made of a film material applied on the substrate. In this method, a mask can be easily formed by using film material with an opening formed in it beforehand.

The substrate may have a semiconductor element. In this method, switching elements such as transistors formed by wiring patterns on the active area or semiconductor chips with built-in semiconductor elements mounted on the active area, can be used as the semiconductor elements.

Semiconductor elements in the non-mounted status on the substrate, that is, not installed semiconductor elements, for instance, those in the silicon substrate status, may also be used in this method.

A wiring pattern formed on an insulating film, which is formed on a substrate, may also be used as the wiring pattern.

According to another aspect of the present invention, there is provided: a manufacturing method of an electro-optical device on which an electronic substrate is mounted, wherein the electronic substrate is manufactured by the manufacturing method mentioned above; and a manufacturing method of an electronic apparatus that has an electro-optical device manufactured by the manufacturing method mentioned above. In these methods, high quality electro-optical device and electronic apparatus formed by highly accurate resistance elements can be formed; moreover, efficient manufacturing of electro-optical device and electronic apparatus without drop in productivity can be realized.

According to yet another aspect of the present invention, there is provided an electronic substrate, includes: a substrate; a wiring pattern formed on the substrate and having a part area that has been subjected to specific treatment; a mask having an opening to suit the part area, wherein the opening has a size based on an accuracy of an alignment between the substrate and the mask.

In this electronic substrate, even if an error occurs in the alignment between the substrate and the mask, since the opening of the mask is formed to a size that includes the offset based on the accuracy of an alignment, the formation of the wiring pattern to a size smaller than the specified size, and the inability to process to the specified size can be easily prevented.

It is preferable that the wiring pattern have a resistance element formed adjacent to the part area. This resistance element is formed by processing the wiring pattern; therefore, an independent process for forming a separate resistance element is not necessary. Thus, the drop in productivity can be avoided.

It is preferable that the substrate have a semiconductor element. In this case, switching elements such as transistors formed by wiring patterns on the active area or semiconductor chips with built-in semiconductor elements mounted on the active area can be used as the semiconductor elements.

A configuration of wiring pattern formed on insulating film, which is formed on the substrate, may also be used as the wiring pattern in the present invention.

DESCRIPTION OF EXEMPLARY EMBODIMENTS

The embodiments of the electronic substrate and its manufacturing method, and the electronic apparatus manufacturing method of the present invention are described below referring to the figures from FIG. 1 to FIG. 8.

Electro-Optical Device

Figure 1:
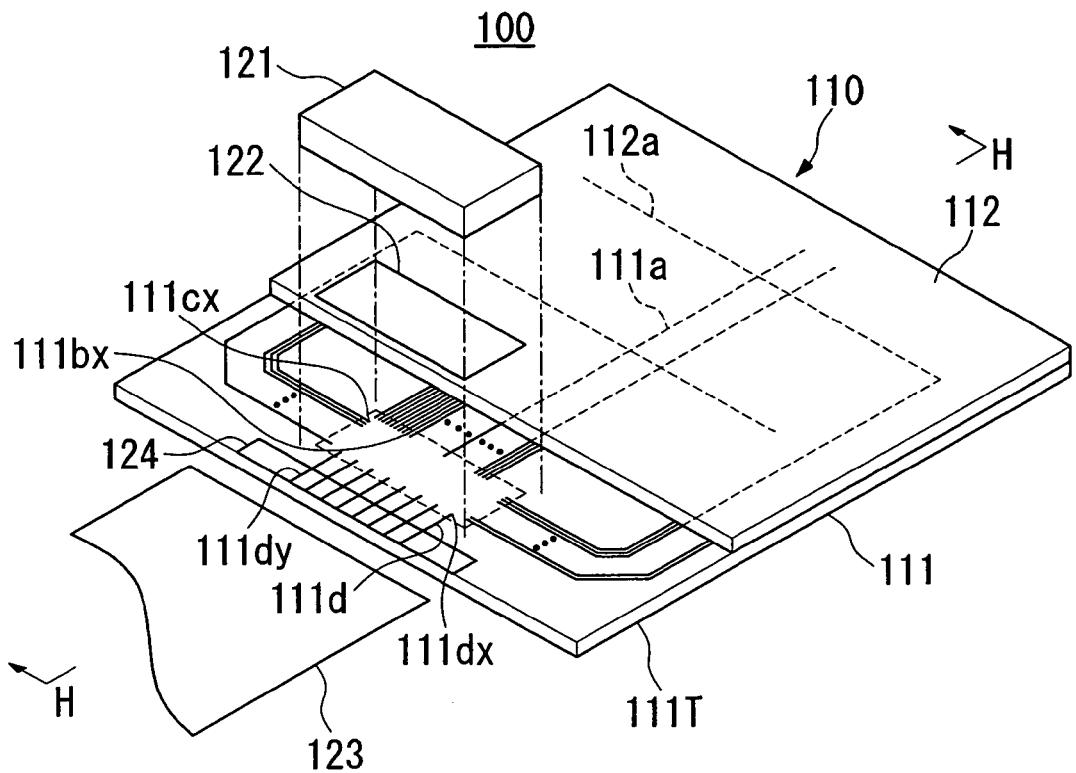
FIG. 1 is a schematic drawing showing a liquid crystal display device, which is the first embodiment of an electro-optical device.

FIG. 1 is a schematic drawing showing a liquid crystal display device, which is the first embodiment of an electro-optical device of the present invention.

The illustrated liquid crystal display device 100 includes a liquid crystal panel 110 and a semiconductor device 121. If necessary, accessory members, not shown in the drawings, such as polarizing plate, reflecting sheet, and backlight may be appropriately installed.

The liquid crystal panel 110 includes substrates 111 and 112 made of glass or plastic. The substrates 111 and 112 face each other, and are stuck to each other using sealing material and the like, not shown in the drawings. Liquid crystal (not shown in the drawings), which is made of electro-optical material, is sealed between the substrate 111 and the substrate 112. An electrode 111a made of a transparent conductor such as Indium Tin Oxide (ITO) is formed on the inner surface of the substrate 111, while an electrode 112 facing the electrode 111a is formed on the inner surface of the substrate 112. Electrode 111a and electrode 112a are disposed perpendicular to each other. The electrode 111a and the electrode 112a are each led to a flared section 111T, at the end of which electrode terminal 111bx and electrode terminal 111cx respectively are formed. Input wire 111d is formed near the edge of flared section 111T, and terminal 111dx is also formed within its end.

A semiconductor device 121 is mounted on the flared section 111T through sealing resin 122. The semiconductor device 121 is an IC chip for driving the liquid crystal that drives the liquid crystal panel 110, for instance. Multiple bump electrodes (not shown in the drawings) are formed on the under surface of semiconductor device 121. These bumps are conductively connected to the terminals 111bx, 111cx, and 111dx on the flared section 111T.

A flexible wiring substrate 123 is mounted on the input terminal 111dy formed on the outer edge of the input wire 111d through an anisotropic conductive film 124. The input terminal 111dy is conductively connected to each of the wires (not shown in the drawings) installed in the flexible wiring substrate 123. Control signals, image signals, power source voltage and the like are supplied to the input terminal 111dy through the flexible wiring substrate 123 from the outside, drive signals for driving the crystals in the semiconductor device 121 are generated, and these are supplied to the liquid crystal panel 110.

According to the liquid crystal display device 100 of the present embodiment configured as mentioned above, by applying appropriate voltage between the electrode 111a and the electrode 112a through the semiconductor device 121, the liquid crystals of a pixel area in which the electrodes 111a and 112a are facing each other can be re-oriented and light can be modulated. As a result, the picture elements in the liquid crystal panel 110 can form the desired image in the display area in which the elements are arranged.

Figure 2:
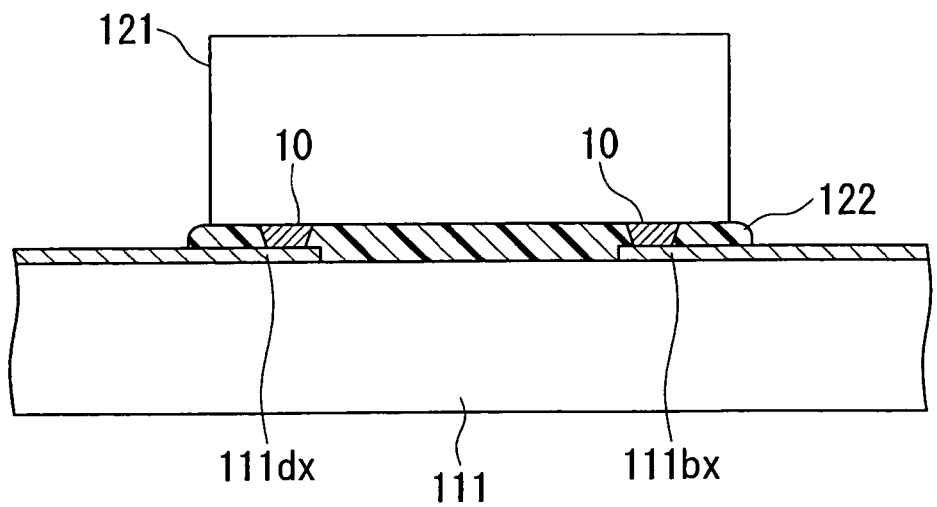
FIG. 2 is an explanatory drawing of the mounting construction of a semiconductor device in the liquid crystal display device.

FIG. 2 is the cross sectional side view along the H-H line in FIG. 1. It is an explanatory drawing showing the mounted construction of semiconductor device 121 on the liquid crystal display device 100. Multiple bump electrodes 10 are installed on the active surface (under surface shown in the drawing) of the semiconductor device 121 as shown in FIG. 2, the front ends of which are in direct conductive contact with terminals 111bx and 111dx of the substrate 111. Cured sealing resin 122 made of a resin such as thermosetting resin is filled around the conductive contact parts between terminals 111bx and 111cx, and the bump electrode 10.

Semiconductor Device

Figure 3:
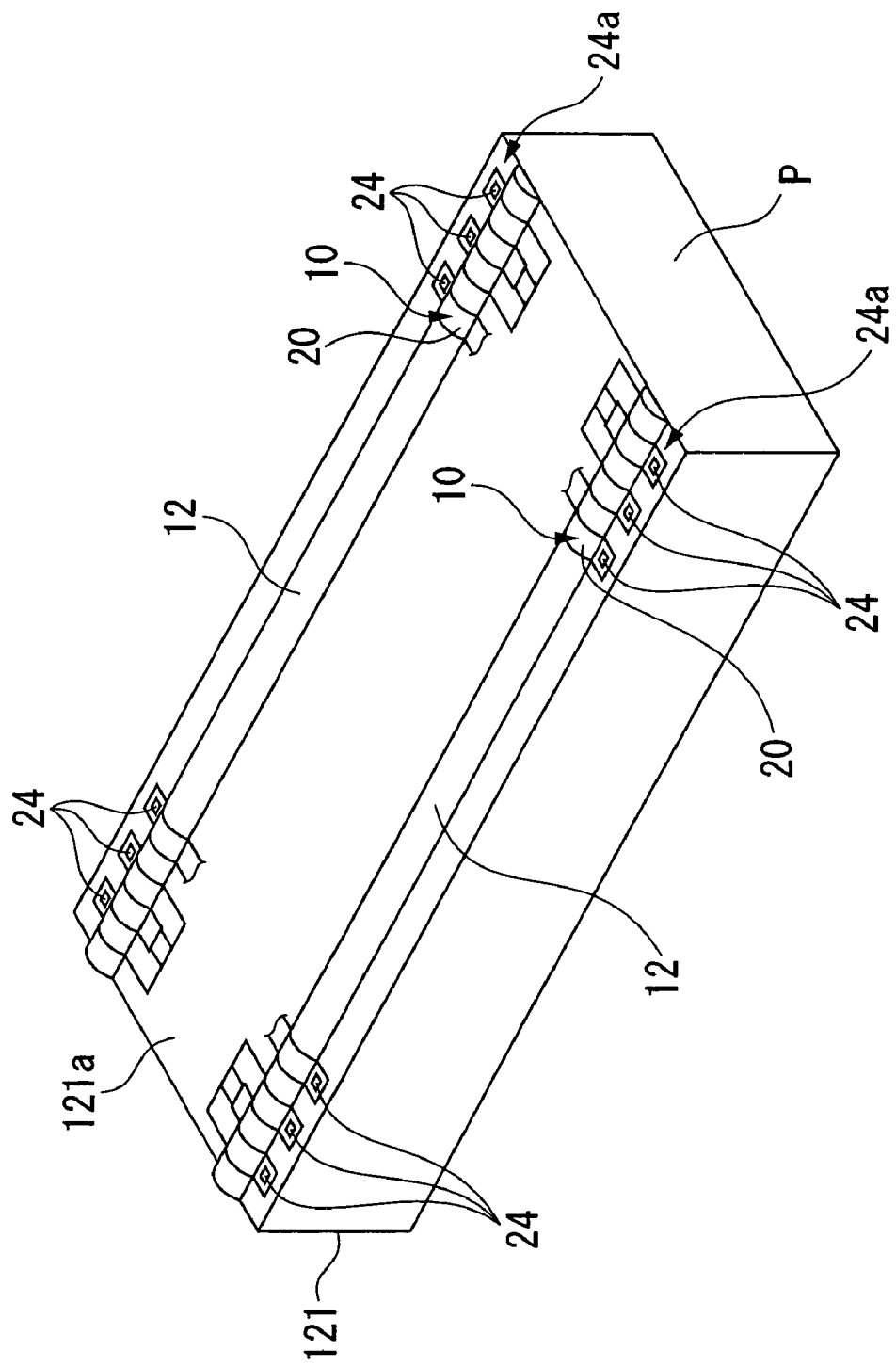
FIG. 3 is a perspective view of the semiconductor device.

Next, the construction of terminals of the semiconductor device 121 is described below. FIG. 3 is a partial perspective view showing the construction on the side of the active surface of the semiconductor device 121 on which terminals are formed.

The semiconductor device 121 may be an IC chip driving picture elements of a liquid crystal display device, and on its active surface side, electronic circuits (integrated circuits) of wiring connecting electronic elements or multiple electronic elements such as thin film transistors are formed (none of which is shown in the drawings).

Multiple electrode pads 24 are aligned along the longer side of active surface 121a of substrate P in the semiconductor device 121 shown in FIG. 3. These electrode pads are drawn from the electronic elements mentioned above, and they function as external electrodes of electronic circuit. On the inside of the electrode pad row 24a in the active surface 121a, resin protrusion 12 is formed as a continuous straight shape extending along the electrode pad row 24a. Furthermore, multiple conductive films 20 are formed as wiring patterns (metallic wiring) connecting the upper part of the resin protrusion 12 and each electrode pad 24 extending from the surface of each electrode pad 24 to the surface of the resin protrusion 12. The bump electrode 10 includes the resin protrusion 12 as the core and multiple conductive films 20 disposed on the surface of the resin protrusion 12. In the example shown in FIG. 3, resin protrusion 12 is arranged on the inside of the electrode pad row 24a, but the resin protrusion 12 may be arranged on the outside of the electrode pad row 24a.

Figure 4A:
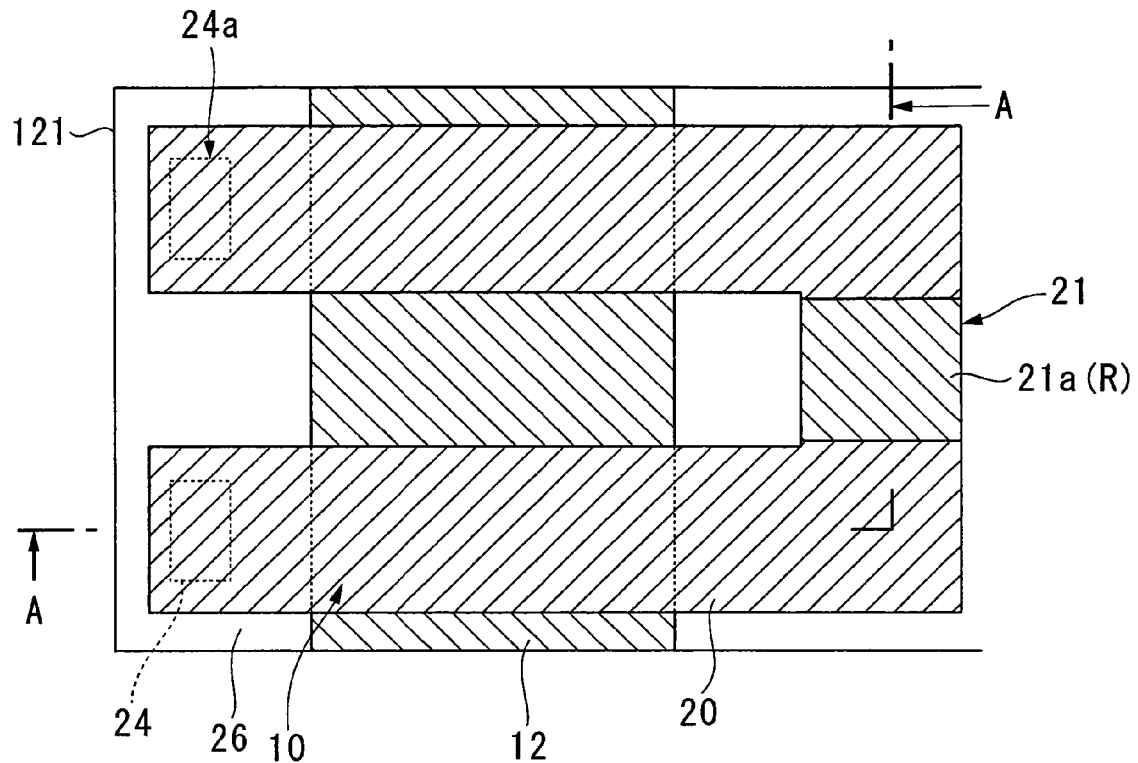
FIG. 4A and FIG. 4B are expanded views of the terminal parts of the semiconductor device.
Figure 4B:
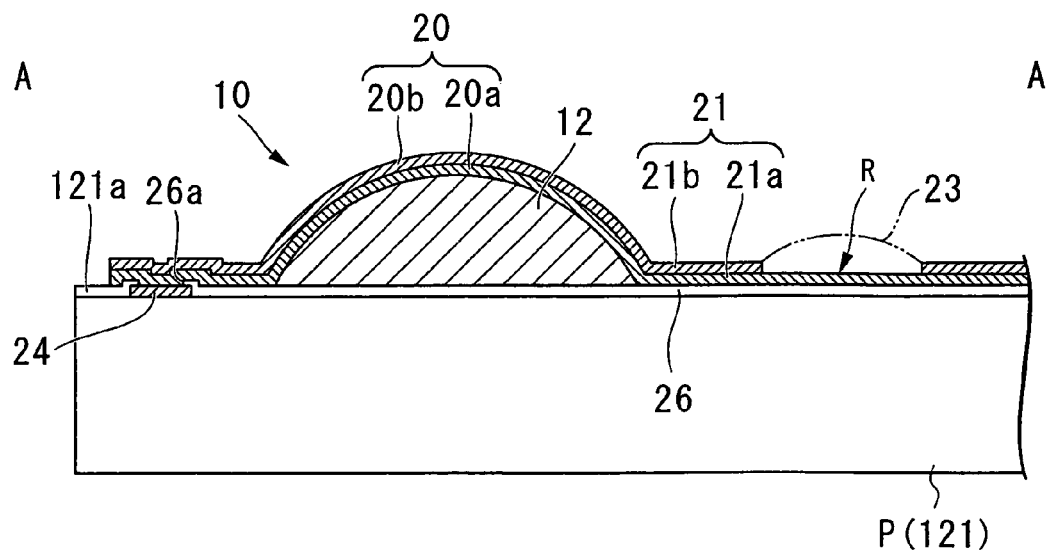

FIG. 4A and FIG. 4B show the configuration of the main part of bump electrode 10. FIG. 4A is the enlarged plan view around the bump electrode, while FIG. 4B is a cross sectional side view along the line A-A in FIG. 4A.

As shown in FIG. 4A and FIG. 4B, multiple electrode pads 24 made of a conductive material such as Al, are arranged and formed at the peripheral edges of the active surface 121a of the semiconductor device 121. A passivation film 26 made of an electrical insulating material such as SiN is formed as a protective layer all over the active surface of the semiconductor device 121. An opening 26a in the passivation film 26 is formed on the surface of each electrode pad 24. An organic resin film such as polyimide film with good stress relaxation property should preferably be formed on the entire surface or part thereof other than the opening in the passivation film 26.

The resin protrusion 12 is formed on the inside of the electrode pad row 24a and on the surface of the passivation film 26. The resin protrusion 12 is formed so as to project from the active surface 121a of the semiconductor device 121, and it extends in a straight line at substantially the same height. It is arranged parallel to the electrode pad row 24a. This resin protrusion 12 is made of an elastic resin material such as polyimide resin or acrylic resin, phenolic resin, epoxy resin, silicone resin, modified polyimide resin, and is formed by using a method such as the injection method. As shown in FIG. 4B, the cross section shape of the resin protrusion 12, should preferably be an elastic shape that can be easily deformed such as a semi circular shape or a trapezoidal shape. In this way, the bump electrode 10 can be elastically deformed with ease during contact with the other substrate, and the reliability of the conductive connection with the other substrate can be enhanced.

Furthermore, conductive film 20 is formed, connecting the upper part of the resin protrusion 12 and each electrode pad 24, extending from the surface of each electrode pad 24 and beyond the surface of the resin protrusion 12. This conductive film 20 is formed as a near U-shape connected to adjacent conductive film 20 by conductive film (wiring pattern) 21 that extends in a direction perpendicular to the conductive film 20 at the end on the side opposite to the electrode pad 24. The conductive films 20 and 21 have a double-layer wiring construction including conductive films (first wiring patterns) 20a and 21a, and conductive films (second wiring patterns) 20b and 21b laminated on the conductive films 20a and 21a.

The conductive films 20a and 21a according to the present embodiment are each formed by sputtering with Tiw at 3000 to 7000 Å (taken here as 3000 Å). The conductive films 20b and 21b are formed with Au, with a higher resistance value than that of conductive films 20a and 21a, at 1000 to 5000 Å (taken here as 1000 Å). Resistance element R formed by removing a part of conductive film 21b and exposing conductive film 21a is provided in conductive film 21.

The material, film composition and area of resistance part of each conductive film used can be varied appropriately according to the resistance value to be obtained. In the embodiment below, the configuration of a double-layered conductive film is described, but details are given later. Conductive films of more than three layers may be combined according to the temperature characteristics and the resistance value to be obtained. Moreover, the conductive film may be formed using known methods such as vapor deposition and plating, in addition to sputtering.

As shown in FIG. 1, the bump electrode 10 is bonded by thermo-compression bonding to terminal 111bx on substrate 111 through sealing resin 122. Sealing resin 122 is a thermosetting resin, and is in the uncured condition or half-cured condition before the mounting. If the sealing resin 122 is in the uncured condition, before the mounting, sealing resin 122 may be coated on the active surface (under surface shown in the drawing) of the semiconductor device 121 or on the surface of the substrate 111. If the sealing resin 122 is in the half-cured condition, then sealing resin 122 may be disposed in the film condition or in the sheet condition between the semiconductor device 121 and the substrate 111. Epoxy resin is generally used as the sealing resin 122, but any other resin may be used if it satisfies the same objectives as epoxy resin.

The semiconductor device 121 is mounted by using a heating and pressurizing head and the like, not shown in the drawings, and disposing the semiconductor device 121 on the substrate 111 while heating and pressurizing it. At this stage, the sealing resin 122 becomes soft initially because of heating, and the upper part of the bump electrode 10 comes in conductive contact with the terminal 111bx by pushing its way through the softened resin. Because of the pressurizing, the resin protrusion 12, an internal resin, is pressurized and it elastically deforms in the direction of contact (vertical direction shown in the drawing). If the heating is continued further in this condition, the sealing resin 122 after cross-linking becomes thermally cured. Thus, even if the pressurizing force is released, the bump electrode 10 is maintained in an elastic deformation condition while in conductive contact condition with the terminal 111bx because of the sealing resin 122.

Semiconductor Device Manufacturing Method

Next, the manufacturing method of semiconductor device is described here, specifically, the process of formation of the bump electrode 10.

FIG. 5A to FIG. 5G are process drawings that show an example of the manufacturing method of semiconductor device 121. This manufacturing method includes a process of forming a passivation layer 26, a process of forming the resin protrusion 12, and a process of forming the conductive films 20 and 21.

The present embodiment uses the inkjet method to form resin protrusion 12.

Figure 5A:
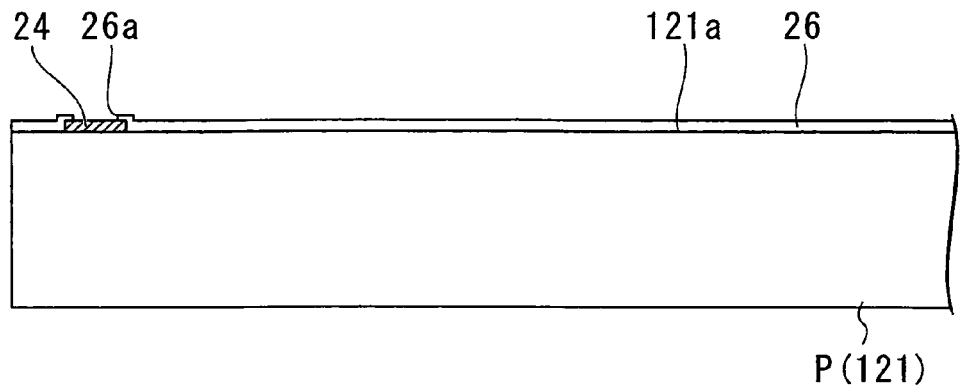
FIGS. 5A, 5B, 5C, 5D, 5E, 5F, and 5G are process drawings for explaining the semiconductor device manufacturing method.

Firstly, as shown in FIG. 5A, a passivation layer 26 is formed on the active; surface 121a of substrate P on which semiconductor elements (not shown in the drawings) are formed. After forming a passivation film 26 made of $SiO_2$, SiN, and the like by the deposition method on the substrate P, opening 26a that exposes the electrode pad 24, is formed by patterning using the photolithographic method.

The resist layer is formed on the passivation film 26 by a method such as the spin coating method, the dipping method, or the spray coating method. Moreover, the resist layer is subjected to exposure and development processes using a mask on which specific patterns are formed, and a resist pattern (not shown in the drawings) of specific shape is formed for the opening 26a. Subsequently, this resist pattern is masked, the above-mentioned film is etched, and the opening 26a for exposing the electrode pad 24 is formed. Then the resist pattern is removed by using a stripper and the like. Dry etching is preferable, using Reactive Ion Etching (RIE) as the preferred process. Wet etching may also be used for etching.

An organic resin film such as polyimide film with good stress relaxation property may be formed on the entire surface or part thereof other than the opening part in the passivation film 26. That is, the resistance element R may be formed on the organic resin film (insulating film) using the methods below.

Figure 5B:
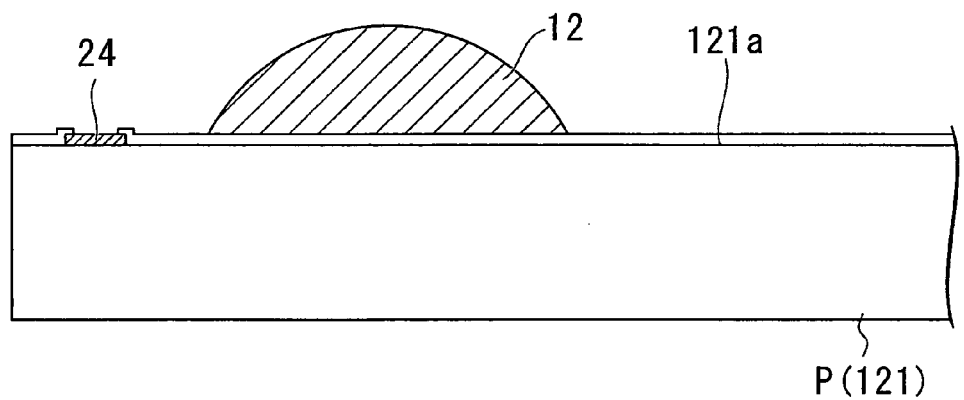

Next, as shown in FIG. 5B, resin protrusion 12 is formed using the inkjet method (droplet ejection method) on the active surface 121 of substrate P on which electrode pad 24 and passivation film 26 are formed. In this inkjet method, resin material in droplet form with the liquid amount per drop controlled using a nozzle installed in the droplet ejection head, is ejected (dripped), the nozzle is faced toward the substrate P, and furthermore, the nozzle and the substrate P are moved relatively to form film pattern of resin material of the desired shape on the substrate P. The resin protrusion 12 is obtained by heat-treatment of this film pattern.

By dripping multiple droplets from the droplet ejection head to dispose the resin material, the shape of the film formed from the resin material can be arbitrarily set, and thick film of resin protrusion 12 can be formed by lamination of the resin material. For instance, dry film of the resin material is laminated and the resin protrusion 12 becomes a proper thick film by repetitively implementing the process of disposing resin material on the substrate P and the process of drying the resin material. Also, by dripping droplets that include resin material from multiple nozzles installed in the droplet ejection head, the amount disposed and the timing of disposition of the resin material can be partially controlled. The resin protrusion 12 may be formed by a method such as photolithographic method, and by allowing the material to droop around the protrusion during curing, resin protrusion 12 of the desired shape may be obtained.

Figure 5C:
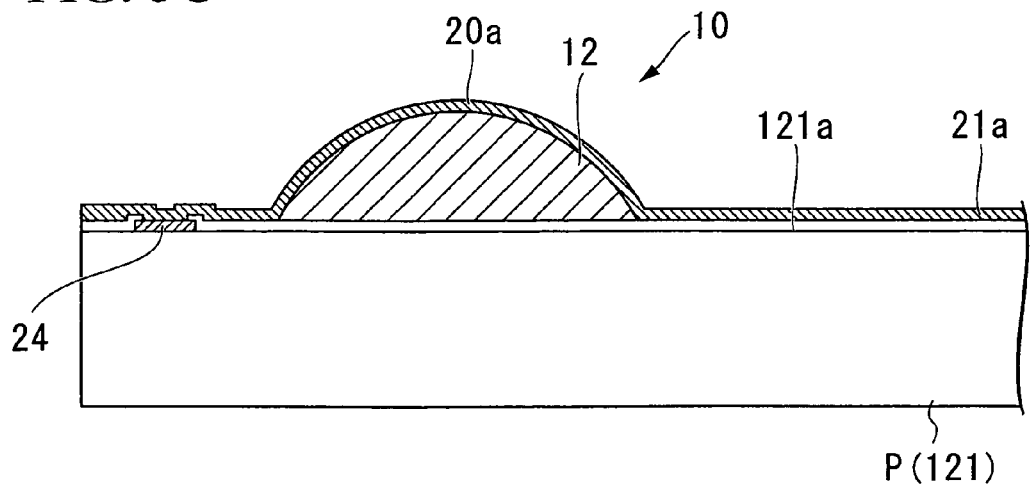

Next, as shown in FIG. 5C, conductive films 20a and 21a are formed as metallic wires that cover the upper parts of electrode pad 24 and resin protrusion 12 extending from the surface of the electrode pad 24 to the resin protrusion 12. These conductive films 20a and 21a are not patterned films but are formed overall.

Figure 5D:
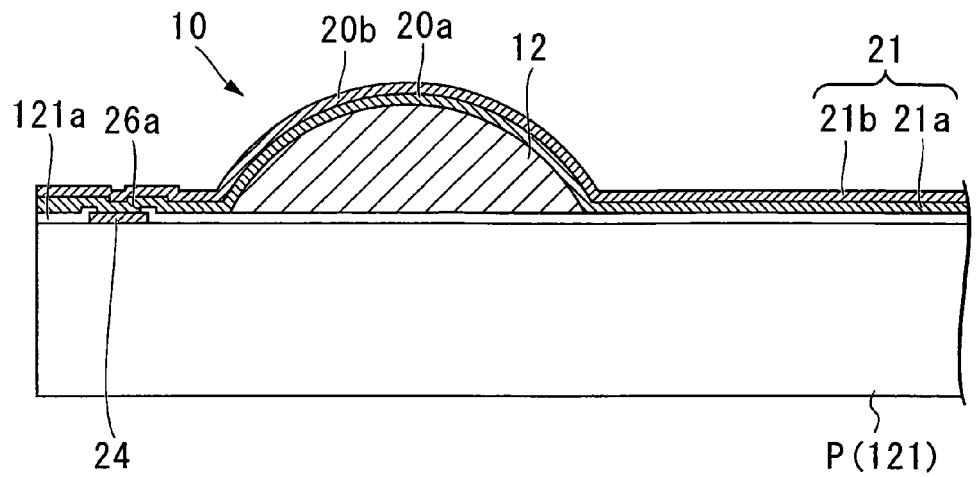

Next, as shown in FIG. 5D, conductive films 20b and 21b are formed on the conductive films 20a and 21a by sputtering. These conductive films 20a and 21a are not patterned films but are formed overall. Subsequently, conductive films 20b and 21b with shape shown in FIG. 3, FIG. 4A, and FIG. 4B are formed by patterning by the photolithographic method, similar to the passivation film 26.

Figure 5E:
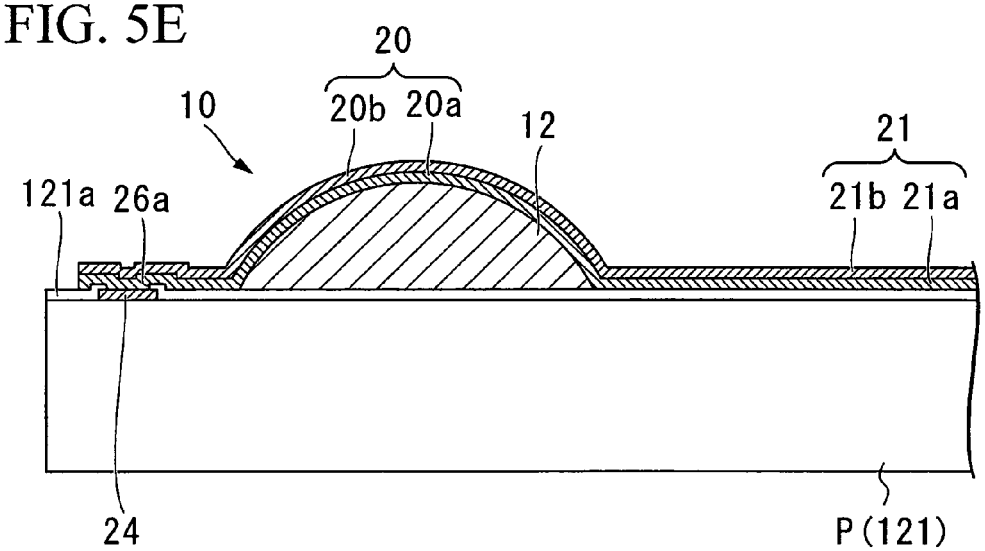

More specifically, resist layer is formed on conductive films 20b and 21b, by methods such as the spin coating method, the dipping method, and the spray coating method. Moreover, the resist layer is subjected to exposure and development processes using mask with specific pattern formed on it, and resist pattern with specific shape is formed (pattern that opens to areas other than specific wiring pattern). Subsequently, this resist pattern is masked and the above-mentioned film is etched. Then the resist pattern is removed by using a stripper to obtain conductive films 20b and 21b of specific shape. Next, the patterned conductive films 20b and 21b are masked and etched. As shown in FIG. 5E, the conductive films 20a and 21a are patterned with the same shape as the conductive films 20b and 21b. The result is that double-layer conductive films 20 and 21 are formed.

Figure 5F:
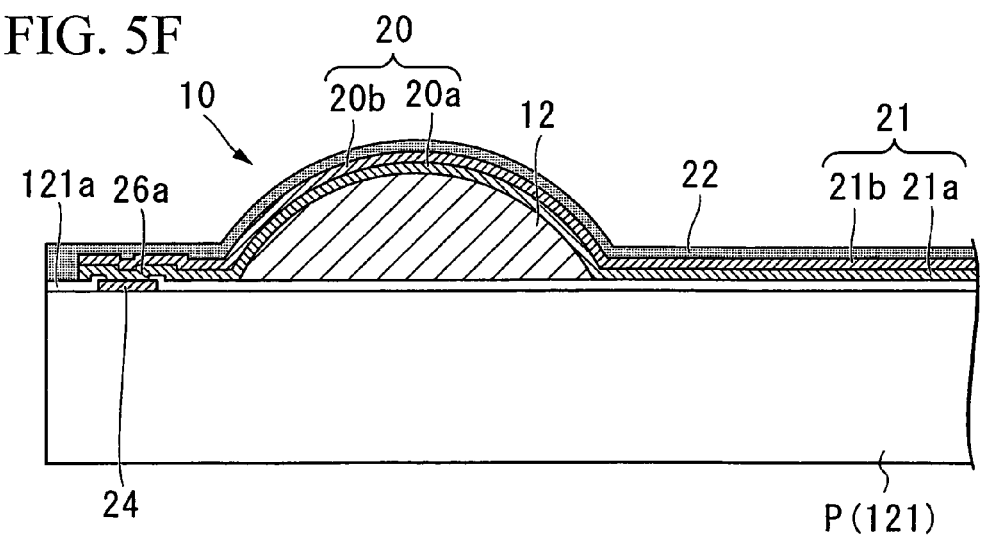

Next, to form the resistance element R, resist layer (resin material) 22 is formed on the conductive films 20 and 21 (passivation film 25 in the region where conductive films 20 and 21 are not formed), as shown in FIG. 5F, by a similar method as described above.

Figure 5G:
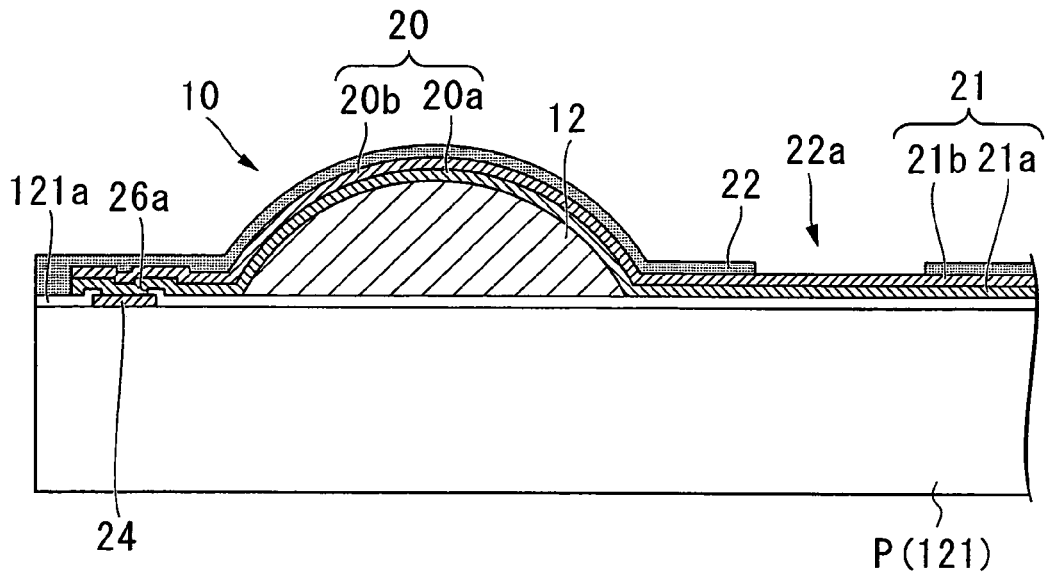

Next, using a mask with an opening to suit the shape of the resistance element R, the resist layer is subjected to exposure and development processes, and opening 22a is formed in the resist layer 22, as shown in FIG. 5G. This resist layer 22 is then masked, only the conductive film 21b is selectively etched and removed, and the conductive film 21a is exposed. Ferric chloride, ammonium persulfate, and the like, may be used as the etching solution.

By removing the resist layer 22 using a stripper and the like, resistance element R with a high resistance value is formed in the conductive film 21, as shown in FIG. 4A and FIG. 4B.

The material, film thickness, and area of the resistance element R are set according to the required resistance value.

The resistance value of Tiw that constitutes conductive films 20a and 21a when the thickness is 1000 Å is about $7 \times 10^{-2}$ $\Omega/m^2$, while that of Au that constitutes conductive films 20b and 21b when the thickness is 1000 Å is about $2 \times 10^{-4}$ $\Omega/m^2$. If a resistance value of 70Ω is required in resistance element R, then conductive films 20b and 21b with a width of 10 microns and length of 100 microns may be removed to form the resistance element R. At this stage, it is beneficial to have the resistance of conductive films 20a and 21a positioned in the lower layer larger than the resistance of the conductive films 20b and 21b positioned in the upper layer, for obtaining a large resistance value.

By varying the thickness of the conductive film mentioned above, or by varying the area of the resistance element R, a resistance element R having a resistance of 50Ω, which is generally used as a terminal resistance, can be easily obtained.

Also, sometimes an error in alignment of the resist layer 22 (more specifically, the opening 22a) and the substrate P (more specifically, the wired conductive film 21) may occur when forming the above-mentioned resist layer 22, which may not allow resistance element R with a specific resistance value to be formed. For instance, if the resist covers the area formed by the resistance element due to misalignment when forming resist layer 22, conductive film 21b remains as residue in the resistance element formation area, and the resistance value of the formed resistance element R changes.

For this reason, the opening 22a is formed to a size based on the error in alignment between the resist layer used as mask and the substrate P in the present embodiment.

Figure 6:
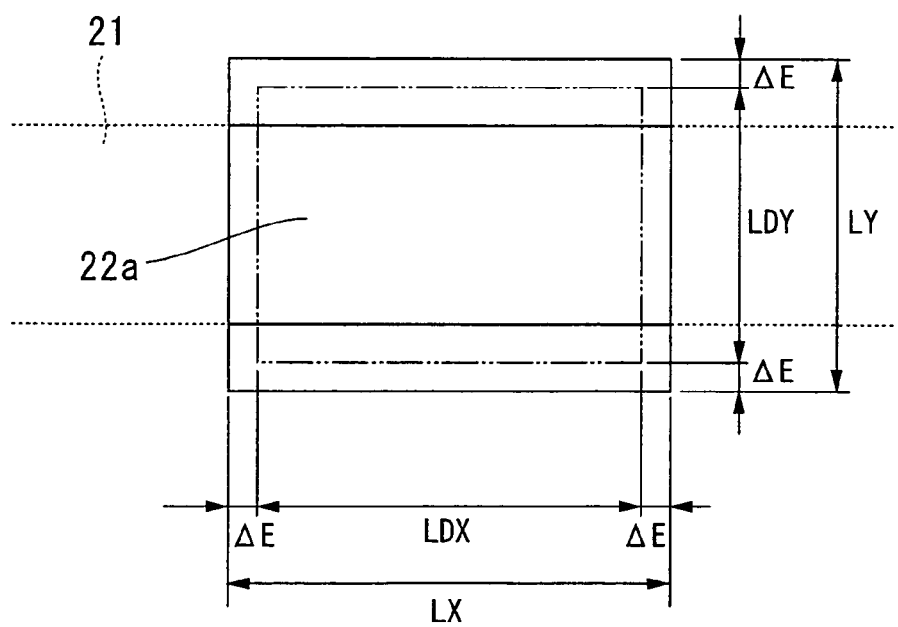
FIG. 6 is a drawing for explaining the size of a mask opening.

More specifically, if the maximum misalignment is estimated as ΔE, then as shown in FIG. 6, the size of the opening 22a (length LX, LY) can be set for the size of the opening 22a (length LDX, LDY) to be formed according to design as shown by the alternate long and two short dashes line.

$$LX = LDX + 2 \times \Delta E, \quad (1)$$

$$LY = LDY + 2 \times \Delta E, \quad (2)$$

The specified resistance value can be obtained by forming the resistance element R by the opening 22a set as described above.

Subsequently, a protective film 23 is formed by covering the resistance element R by resin material such as solder resist, as shown in the alternate long and two short dashes line. This helps to enhance the humidity resistance of the resistance element R. This protective film 23 should preferably be formed to cover at least the resistance element R, and it can be formed by using a method such as photolithographic method, droplet ejection method, printing method, or dispensing method.

As described above, according to the present embodiment, the opening 22a is formed to a size based on the error alignment between the resist layer 22, which is the mask, and the substrate P. Therefore, even if a resist layer 22 with low alignment accuracy with respect to the substrate P is used as mask, resistance element R with the specified area can be easily formed, and the desired resistance value can be obtained with a high accuracy.

Moreover, according to the present embodiment, resistance element R can be formed easily by removing conductive film 21b from the double-layered conductive film 21. Particularly, since the conductive film 21a positioned in the lower layer has a larger resistance than the conductive film 21b positioned in the upper layer, a larger resistance value can be easily obtained. The same holds good for constructions with three or more layers.

Electronic Apparatus

Next, electronic apparatus provided with electro-optical device or semiconductor device is described below.

Figure 7:
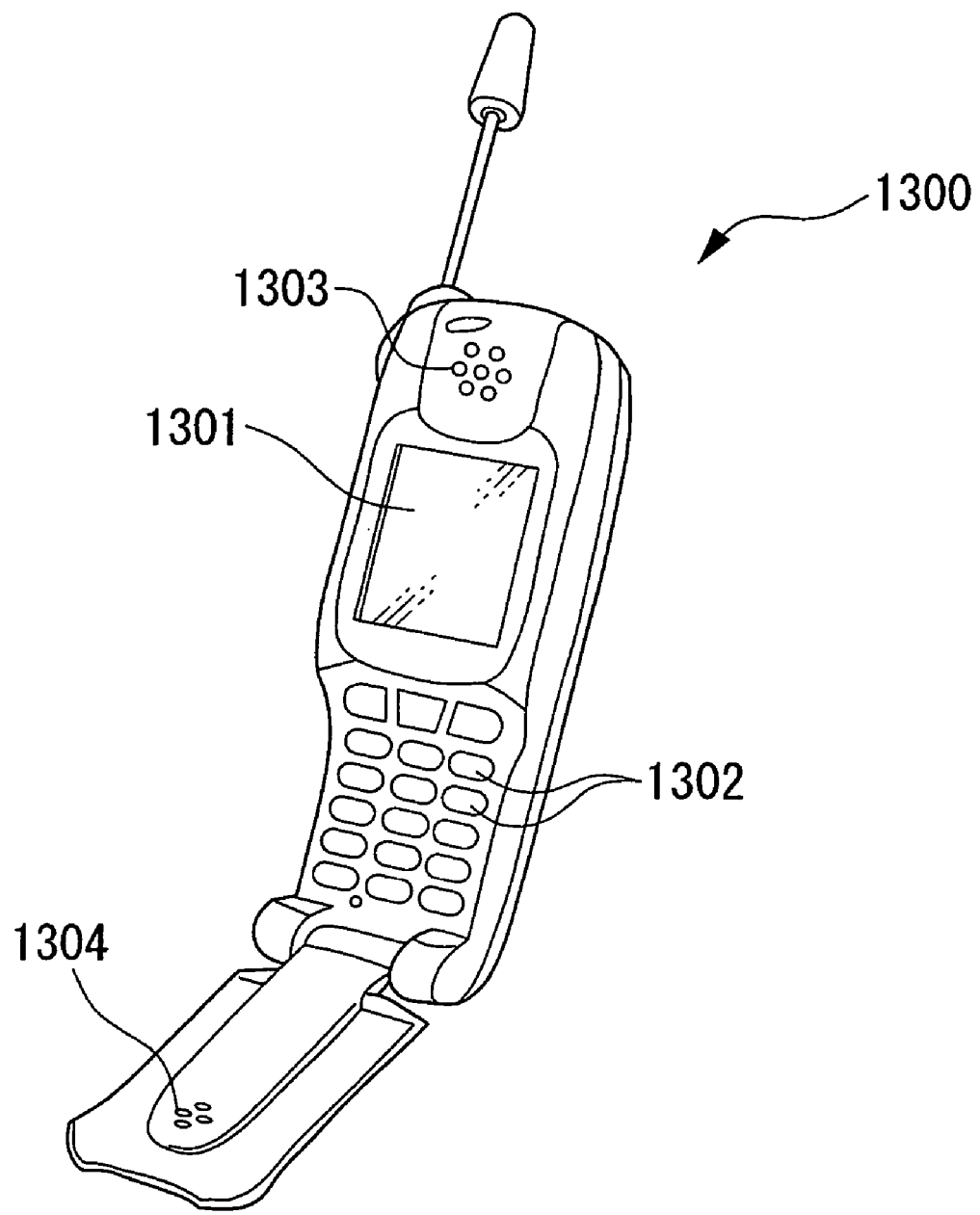
FIG. 7 is a perspective view showing an example of electronic apparatus.

FIG. 7 is a perspective view showing an example of electronic apparatus related to the present invention. Mobile telephone 1300 shown in this figure includes the above-mentioned electro-optical device in the form of a small-sized display unit 1301, multiple control buttons 1302, earpiece 1303, and mouthpiece 1304.

The above-mentioned electro-optical device is not limited to the mobile telephone mentioned above, and it can be used preferably as image display means in various kinds of apparatus provided with touch panels such as electronic book, personal computer, digital still camera, liquid crystal display television, viewfinder type or monitor direct viewing type video tape recorder, car navigation apparatus, pager, electronic organizer, calculator, word processor, workstation, TV phone, POS terminal, and the like. In all the apparatus, the resistance value can be accurately obtained, and electronic apparatus with excellent quality can be offered.

The preferred embodiments related to the present invention have been described referring to the attached drawings as above, however, the present invention is not restricted to the examples given. The various shapes of component members or combinations thereof are examples, and various kinds of changes based on design requirements and the like may occur within the scope of the gist of the present invention.

For instance, in the embodiment mentioned above, resistance element R was formed in the electrode film 21, but it is not limited to electrode film 21 only, and the resistance element may be formed in electrode film 20 also. In the embodiment mentioned above, adjacent conductive films 20 were connected by conductive film 21, but it is not limited to this configuration. Resistance element may be installed in a part of the re-oriented wires that form the external connection terminal.

In the embodiment mentioned above, resistance element R was formed by removing one layer of film from the double-layered electrode film 21. Note, however, that the present invention is not limited to a double-layered film; electrode film with a single layer or electrode film with more than three layers may be used also. For instance, if an electrode film with a single layer is used, the thickness may be adjusted by adjusting the etching time, and the desired resistance value may be obtained. A three-layered electrode film can be configured by forming say Tiw-Cu first by sputtering, and then forming Cu layer by plating. Resistance element can be formed with Tiw-Cu by sputtering after removing electrode film by Cu plating, or resistance element can also be formed with only Tiw electrode film after removing the Cu (sputtering)-Cu (plating) electrode film.

Moreover, even if a double-layered electrode film is used, a part of the upper conductive film 21b may be allowed to remain in the thickness direction, and resistance element may be formed with the remaining conductive film 21b and the lower conductive film 21a. Furthermore, after removing the conductive film 21b, conductive film 21a may be etched, and a resistance element with a higher resistance value can be formed with a thinner conductive film 21a. In any case, by removing a part of the conductive film to suit the desired resistance value, a resistance element with the relevant resistance value can be easily formed.

Figure 8A:
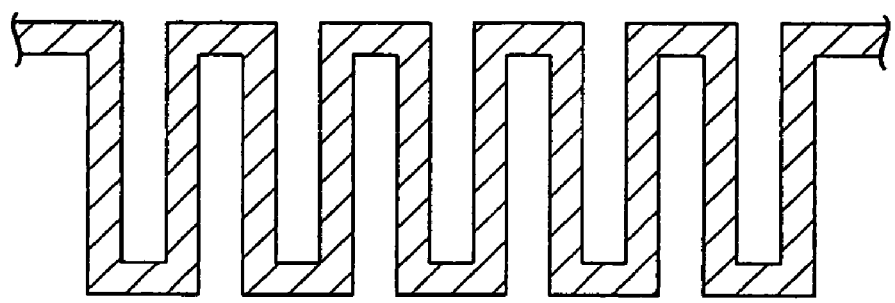
FIG. 8A and FIG. 8B are plan views showing the examples of modification of the resistance elements.
Figure 8B:
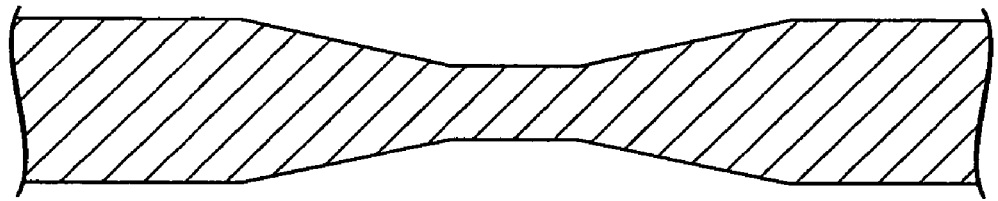

Furthermore, the method of forming resistance element is not limited only to removal of material in the thickness direction. As shown in FIG. 8A, resistance element with large resistance and large length using electrode film with a meandering shape, or as shown in FIG. 8B, a resistance element with a reduced diameter part having a large resistance, may also be used.

The material of conductive film (resistance element) shown in the above-mentioned embodiment is only one example, and other conductive materials such as Ag, Ni, Pd, Al, Cr, Ti, W, NiV, or lead-free solder materials and the like may also be used. In these cases also, when forming layered conductive film using multiple materials, it is preferable to select the materials such that the conductive film positioned in the lower layer has a higher resistance than the conductive film positioned in the upper layer.

By selection and combination of materials, not only can the desired resistance value be obtained, but also by focusing on the resistance-temperature characteristics of each material and appropriately combining the materials, the desired resistance-temperature characteristics can be obtained.

In the above-mentioned embodiment, the conductive films 20 and 21 were formed by sputtering method and plating method, but the inkjet method may also be used.

Furthermore, in the above-mentioned embodiment, the resist layer 22 was used as a mask, but it is not limited to resist layer only, and film materials such as dry film may also be used as the mask.

In this case, opening of size that suits the resistance element may be formed beforehand on the film material, and this film material may be stuck on the substrate P on which conductive films 20 and 21 have been formed. The opening size at this stage may be taken as LX and LY, which were set in equations (1) and (2) given above.

In the embodiment above, the example of a semiconductor device that includes electronic substrate with semiconductor elements was used, but the electronic substrate related to the present invention does not necessarily require semiconductor elements to be installed. For instance, a non-mounted silicon substrate in which external devices are not mounted in the area provided for mounting external devices (active area) of the semiconductor chip, may be included. In this case, the electronic substrate related to the present invention may be connected to the circuit substrate with semiconductor elements through the bump electrode 10.

What is claimed is:

1. An electronic substrate manufacturing method, comprising:

providing a substrate having a surface on which electrode sections are disposed in a row along a first direction;

providing a resin member on the surface of the substrate, the resin member being adjacent to the electrode sections and extending substantially along the first direction;

forming a wiring pattern on the substrate, the forming of the wiring pattern comprising forming a first conductive film on the substrate, and forming a second conductive film on the first conductive film, the second conductive film made of a material different from that of the first conductive film, the material of the first conductive film having a resistance value higher than that of the material of the second conductive film, the wiring pattern having a first line pattern and a second line pattern that extend along a second direction intersecting with the first direction and that are electrically connected to the electrode sections, a part of each of the first and second line patterns covering the resin member, the wiring pattern further having a connecting portion that connects the first line pattern and the second line pattern, the resin member being disposed between the electrode sections and the connecting portion;

providing a mask with an opening for the substrate on which the wiring pattern has been formed, the opening having a size based on an accuracy of an alignment between the substrate and the mask; and performing a specified treatment in a part area of the wiring pattern through the opening of the mask, the performing of the specified treatment comprising removing a part of the second conductive film to form a resistance element at the connecting portion of the wiring pattern.

2. The electronic substrate manufacturing method according to claim 1, wherein
the size of the opening is greater than a sum of a size of the part area and a permissible error of the alignment.

3. The electronic substrate manufacturing method according to claim 1, further comprising covering with a protective film the wiring pattern on which the specified treatment has been performed.

4. The electronic substrate manufacturing method according to claim 1, wherein the mask is made of a resin material coated on the substrate.

5. The electronic substrate manufacturing method according to claim 1, wherein the mask is made of a film material applied on the substrate.

6. The electronic substrate manufacturing method according to claim 1, wherein the substrate is provided with a semiconductor element.

7. The electronic substrate manufacturing method according to claim 1, wherein the substrate is provided with no semiconductor element.

8. The electronic substrate manufacturing method according to claim 1, further comprising forming an insulating film on the disposed between the substrate and the wiring pattern.

9. A manufacturing method of an electro-optical device on which an electronic substrate is mounted, wherein the electronic substrate is manufactured by the manufacturing method according to claims 1.

10. A manufacturing method of an electronic apparatus that has an electro-optical device manufactured by the manufacturing method according to claim 9.

* * * * *